United States Patent [19]
Hasegawa et al.

[11] Patent Number: 5,578,421
[45] Date of Patent: Nov. 26, 1996

[54] PHOTOMASK AND PATTERN FORMING METHOD EMPLOYING THE SAME

[75] Inventors: Norio Hasegawa; Fumio Murai, both of Tokyo; Katsuya Hayano, Hachioji, all of Japan

[73] Assignee: Hitachi, Ltd., Tokyo, Japan

[21] Appl. No.: 418,402

[22] Filed: Apr. 7, 1995

Related U.S. Application Data

[62] Division of Ser. No. 162,319, Dec. 7, 1993, Pat. No. 5,429,896.

[30] Foreign Application Priority Data

Dec. 7, 1992 [JP] Japan ..................... 4-326433

[51] Int. Cl.⁶ .................................. G03C 5/00
[52] U.S. Cl. ................ 430/313; 430/322; 430/394; 430/397
[58] Field of Search .................. 430/5, 394, 397, 430/313, 322

[56] References Cited

U.S. PATENT DOCUMENTS

| | | | |
|---|---|---|---|
| 4,360,586 | 11/1982 | Flanders et al. | 430/321 |
| 4,890,309 | 12/1989 | Smith et al. | 378/35 |
| 5,328,807 | 7/1994 | Tanaka et al. | 430/311 |
| 5,364,716 | 11/1994 | Nakagawa et al. | 430/5 |

FOREIGN PATENT DOCUMENTS

| | | |
|---|---|---|
| 62-50811 | 10/1987 | Japan . |
| 4-136854 | 5/1992 | Japan . |

OTHER PUBLICATIONS

Journal of Vacuum Science Technology, 16(6), Nov./Dec. 1979, "Spatial period division–A new technique for exposing submicrometer–line width periodic and quasiperiodic patterns", Flanders et al, pp. 1949–1952.

Primary Examiner—S. Rosasco
Attorney, Agent, or Firm—Fay, Sharpe, Beall, Fagan, Minnich & McKee

[57] ABSTRACT

A semitransparent phase shifting mask has, in the periphery of a pattern element area, a light shielding portion which is formed by a semitransparent phase shifting portion and a transparent portion with the optimal size combination. A pattern is formed employing the semitransparent phase shifting mask.

29 Claims, 4 Drawing Sheets

PHOTOMASK AND PATTERN FORMING METHOD EMPLOYING THE SAME

This is a divisional application of U.S. Ser. No. 08/162,319, filed Dec. 7, 1993 now U.S. Pat. No. 5,429,896.

BACKGROUND AND SUMMARY OF THE INVENTION

The present invention relates to a photomask which is used to manufacture a semiconductor device and the like, and more particularly to a photomask which has been subjected to a processing of shifting a phase of exposure light beams and a pattern forming method employing the same.

Along with an increase of the integration scale for semiconductor devices, sizes of patterns for forming constituent elements of the devices become fine, and sizes equal to or smaller than the critical resolution of a projection aligner are required. As a method of fulfilling such a request, in JP-B-62-50811 published on Oct. 27, 1987, and corresponding to JP-A-57-62052 (laid open on Apr. 14, 1982) for example, a photomask is employed in which a transparent film for shifting a phase of exposure light beams is provided on a transparent portion on one of the opposite sides sandwiching an opaque portion, and thus the resolution of a pattern is exceptionally improved.

In the above-mentioned prior art, a phase shifter needs to be arranged in one of the transparent portions adjacent to each other, and for the arrangement of the phase shifter in the complicated element pattern, high trial and error is necessarily required. Thus, there is required considerable labor. In addition, since the number of processes of manufacturing a photomask is doubled as compared with the prior art, the reduction in yield and the increase in cost become problems.

Those problems can be settled by employing a semitransparent phase shifting mask in which a semitransparent portion and a transparent portion are provided, and some of the light beams passed through the semitransparent portion are phase-inverted with respect to light beams having passed through the transparent portion. With respect to this point, the description will hereinbelow be given with reference to the accompanying drawings.

Figure 1A:
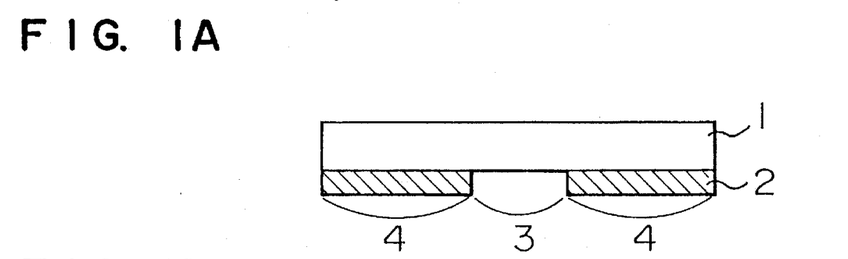
FIGS. 1A and 1B are respectively a cross-sectional view showing a structure of a semitransparent phase shifting mask, and a view showing the light intensity distribution of projected light beams on a wafer when using the mask shown in FIG. 1A.

FIG. 1A is a cross sectional view showing a structure of an example of a semitransparent phase shifting mask. In the figure, reference numeral 1 designates a transparent substrate, and reference numeral 2 designates a semitransparent film. A thickness of the semitransparent film 2 is adjusted such that the light beams having passed through the transparent portion 3 are phase-inverted with respect to the light beams having passed through a semitransparent portion 4. The semitransparent film 2 has a transmittance such that a light beam having passed through the transparent substrate 1 and the semitransparent film 2 has an intensity high enough to cause interference with a light beam having passed through the transparent substrate 1. The transparent film used in this specification means a film having the above-mentioned transmittance.

Figure 1B:
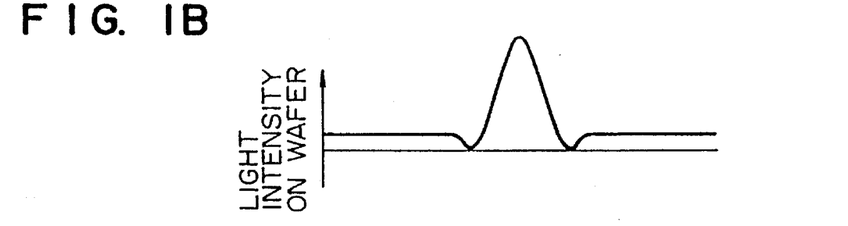

The light intensity distribution of the projected light beams on a wafer becomes, as shown in FIG. 1B, a sharp light intensity distribution. The reason such a sharp light intensity distribution is obtained is that, since the light beams having passed through the transparent portion are phase-inverted with respect to the light beams having passed through the semitransparent portion, the former and the latter cancel each other in a boundary portion of the pattern so that the light intensity becomes approximately zero. In addition, since the intensity of the light beams having passed through the semitransparent portion is adjusted be equal to or lower than the sensitivity of a photoresist, the intensity of the light beams having passed through the semitransparent portion is not an obstacle to the formation of the pattern. That is, in this method, since the phase inversion effect between the pattern to be transferred and the semitransparent portion therearound is utilized, there is no need to take, as in the normal phase shifting mask, the arrangement of the phase shifter into consideration. In addition, in the prior art phase shift mask, the two lithography processes are required for the formation of the mask. However, in this method, one lithography process has only to be performed. Thus, it is possible to form the mask very simply.

In this method, the light beams, which have an intensity that is equal to or lower than the sensitivity of a photoresist to which the pattern of the mask is to be transferred, are made to pass through the semitransparent film so that the light beams which have passed through the semitransparent film are phase-inverted with respect to the light beams which have passed through the transparent portion, and thus, the contrast of the pattern is improved. As a result, it is possible to improve the resolution of an aligner for transferring the mask pattern. The basic principle of the semitransparent phase shifting mask is described in D. C. Flanders et al.: "Spatial Period Division—A New Technique for Exposing Submicrometer-Linewidth Periodic and Quasi periodic Patterns" J. Vac. Sci. Technol., 16(6), Nov./Dec. pp 1949 to 1952 (1979), U.S. Pat. Nos. 4,360,586 and 4,890,309 and JP-A-4-136854 (laid open on May 11, 1992).

In the lithography process in which the above-mentioned semitransparent phase shifting mask is employed, in the normal exposed area, good pattern formation can be performed. However, it has been made clear by the investigations made by the present inventors that since in the actual exposure of the wafer, the mask pattern is repeatedly transferred by step-and-repeat exposure, the light beams which have leaked from the semitransparent area, which is located outside the periphery of the actual pattern element corresponding to an active region of a substrate, leak out to the adjacent exposed area, and thus this is an obstacle to good pattern formation.

It is therefore an object of the present invention to provide a photomask by which a good pattern can be obtained even in the case of an exposure, in which a mask pattern is repeatedly transferred by step-and-repeat exposure, and a pattern forming method employing the same.

According to one aspect of the present invention, the above-mentioned object can be attained by effectively making a light-shielding or opaque area of a semitransparent phase shift mask which is located outside the periphery of a pattern element formation area of the semitransparent phase shifting mask.

The light shielding portion in the semitransparent phase shifting mask is formed by processing a semitransparent film to obtain a pattern having a width equal to or lower than the resolution. The reason for adopting such a method is that if a light shielding film is newly formed as the light shielding portion, this will result in an increase of the number of processes of forming the mask. Incidentally, by optimizing the area ratio of the semitransparent portion to the transparent portion, it is possible to further effectively form the light shielding portion.

These and other objects and many of the attendant advantages of the invention will be readily appreciated as the same become better understood by reference to the following detailed description when considered in connection with the accompanying drawings.

DESCRIPTION OF THE PREFERRED EMBODIMENTS

When both a semitransparent phase shifting pattern and a transparent pattern are arranged with the same size and at a pitch equal to or lower than the critical resolution, a pattern image can be erased. But, in this case, the resulting uniform light intensity does not become zero because, since there is a difference between the quantity of light beams having passed through the semitransparent phase shifting portion and that of light beams having passed through the transparent portion, the function of those light beams cancelling each other due to the phase inversion effect is not efficiently performed.

Then, when the ratio of the area of the semitransparent phase shifting portion to that of the transparent portion is adjusted in accordance with a set transmittance of the semitransparent phase shifting portion, it is made clear that the light intensity can be zero. By using this pattern for an area of a to-be-exposed wafer surface, which may be otherwise undesirably double-exposed by the step-and-repeat process by an aligner, it is possible to prevent the double exposure on the wafer, and a pattern of constituent elements as desired can be formed. Therefore, since the present photomask is made up of only semitransparent phase shifting portions and transparent portions, there is no need to newly form a light shielding film for the formation of the light shielding portion, and thus, the process of forming the photomask can be simplified.

Incidentally, the above-mentioned light shielding portion is applicable to the formation of a light shielding portion in a pattern element region of a substrate. In this case, since the ratio of the transmittance of the transparent portion to that of the light shielding portion can be made large, it is possible to increase the tolerance for the variation of the quantity of light beams required for the exposure.

As for the materials used for the formation of the semitransparent phase shifting portion, a lamination film of a semitransparent metal film (made of chromium, titanium or the like) or a silicide film (e.g., a molybdenum silicide film) and a silicon oxide film for the phase shift, or a single layer film such as a metal oxide film (e.g., a chromium oxide film) or metal nitride film (e.g., a chromium nitride film) may be employed. In the case where a single layer film such as a chromium oxide film or a chromium nitride film is employed, since the refractive index thereof is larger than that of the silicon oxide film, the film can be thinned. As a result, since the influence of the light diffraction can be reduced, this single layer film is suitable for the formation of a fine pattern.

EMBODIMENT 1

Figure 2A:
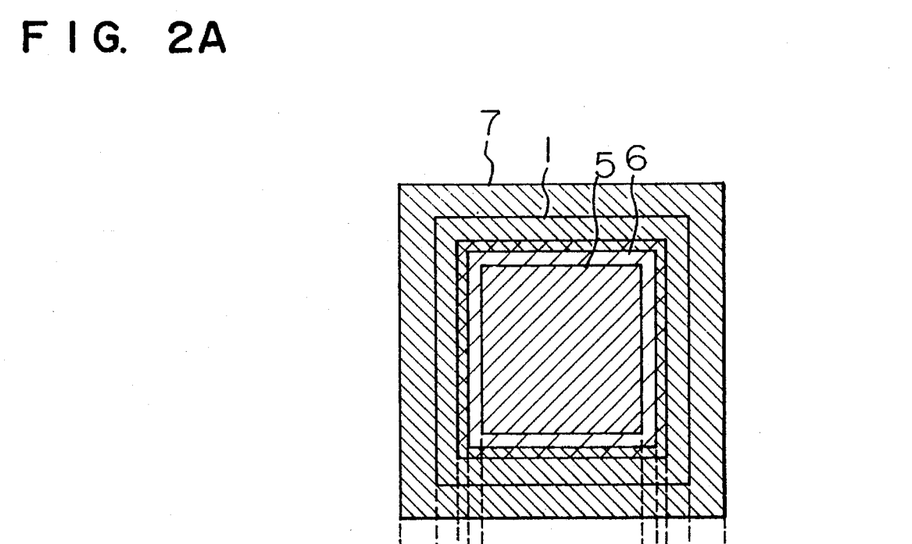
FIGS. 2A and 2B are respectively a plan view and a cross sectional view each showing a structure of a photomask according to the present invention.
Figure 2B:
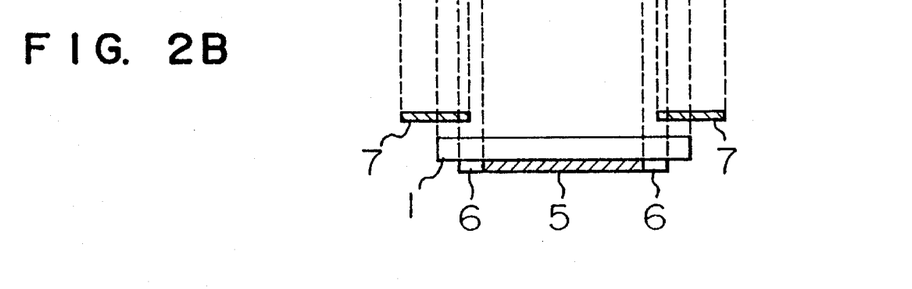

A first embodiment of the present invention will hereinafter be described in detail. FIGS. 2A and 2B are respectively a plan view and a cross sectional view each showing the appearance of a photomask employed in the present embodiment. In those figures, reference numeral 1 designates a transparent substrate, and reference numeral 5 designates an element pattern portion in which both a semitransparent phase shifting portion and a transparent portion are arranged. Moreover, reference numeral 6 designates a portion acting, on a wafer, as a light shielding portion in which semitransparent phase shifting patterns are arranged at a pitch equal to or smaller than the resolution.

Reference numeral 7 designates a masking blade for shielding, on the aligner side, the exposure light beams. Since the masking blade 7 is poor in positional accuracy, it is positioned so as to shield the light beams passing through the portion which is located outside the intermediate position of the width of the area 6 acting as the light shielding portion.

Figure 3A:
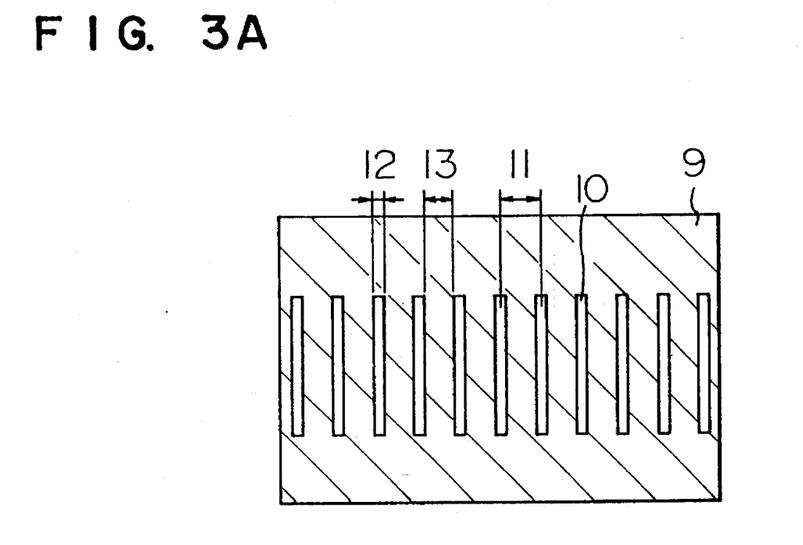
FIG. 3A is a plan view showing a structure of a light shielding portion of the photomask according to the present invention.

The details of the area 6 acting as the light shielding portion will hereinbelow be described with reference to FIGS. 3A and 3B. FIG. 3A is a plan view showing a structure of a pattern. In this connection, each transparent pattern portion 10 is formed within a semitransparent phase shifting portion 9. An arrangement pitch 11 of the transparent patterns 10 is determined depending on the resolution characteristics of the projection optical system employed. The arrangement pitch P is expressed by the following expression:

$$P = \alpha \cdot \lambda / NA$$

where NA represents a numerical aperture of a projection lens, $\lambda$ represents a wavelength of the exposure light beams, and $\alpha$ represents a coefficient.

In this connection, on the basis of the experiments made by the present inventors, it is desirable that the coefficient $\alpha$ is set to a value equal to or smaller than 0.8. However, the optimal value of $\alpha$ is not limited thereto or thereby because the optimal value of $\alpha$ depends on the characteristics of the illuminating system, the pattern configuration and the like.

The width 12 of the transparent pattern 10 influences largely the formation of a dark portion. FIG. 3B shows the intensity of the projected light beams which is obtained on the wafer when changing the width 12 of the transparent pattern 10. The intensity of the projected light beams shows the intensity of the light beams which have passed through the pattern of FIG. 3A. The pitch of the transparent patterns 10 was determined to be 0.4 μm by using α=0.1 in the expression of the arrangement pitch.

With respect to the three kinds of transmittance 9%, 16% and 25% of the semitransparent phase shifting portion, the change in the intensity of the projected light beams were examined by changing the size of the transparent pattern 10. The axis of abscissa of the graph represents the size of the transparent pattern 10. From the graph of FIG. 3B, it can be seen that a minimum value is present in the intensity of the projected light beams depending on the size of the transparent pattern, and this local minimum value is variable depending on the transmittance of the semitransparent phase shifting portion. That is, it can be seen that in accordance with the transmittance of the semitransparent phase shifting portion 9, an optimal transparent pattern size can be found.

Denoting the size ratio of size 12 of the transparent pattern to the size 13 of the semitransparent phase shifting portion 13 by α, an optimal value thereof will be expressed by the following expression:

$$\alpha = \beta \cdot \sqrt{T},$$

where T represents a transmittance of the semitransparent phase shifting portion, and β represents a coefficient. The allowable intensity of the projected light beams is variable depending on the intended purpose. In the case of preventing exposure of a photoresist due to a double exposure, the allowable intensity of the projected light beams may be set to about one-half the intensity of light which has passed through the semitransparent phase shifting portion. However, in the case of preventing a double exposure of a dark portion with a fine pattern-containing portion, the change in the size of the fine pattern needs to be reduced as much as possible, and thus it is desirable that the allowable intensity of the projected light beams is set to a value equal to or lower than 0.05. The value of β in this case is in the range of about 0.5 to about 2.0.

Then, the area 6 of FIG. 2A was formed on the basis of the optimal conditions thus obtained, and by actually using the projection aligner, the pattern element 5 corresponding to the active region was exposed by the step-and-repeat process. As a result, a good pattern element corresponding to the active region could be formed without pattern destruction and size shifting even in the area in which the area 6 was doubled-exposed.

As described above, the semi-transparent phase shifting portion and the transparent portion were formed with the optimal size combination, whereby the effective dark portion could be formed. Incidentally, although in the present embodiment, the example is shown in which the line transparent pattern is formed in the semitransparent phase shifting area, the present invention is not limited thereto or thereby. That is, for example, there is particularly no problem even in the case of an island-like pattern and other patterns. In such cases, if α in the expression α=β·√T is replaced with the area ratio of the area of the transparent pattern to the area of the semi-transparent phase shifting portion, substantially the same effects can be obtained.

In addition, in the present embodiment, the combination of the semitransparent phase shifting pattern and the transparent pattern is applied to prevent the double exposure. However, this application of the present invention is not limited thereto or thereby. It is, of course, to be understood that the combination is applicable to the necessary portions such as a window pattern for aligning the mask position, a pattern for detecting the wafer position, and a semitransparent phase shifting portion having a large area, all of which require a light shielding portion. Further, the above-mentioned photomask having a light shielding portion is useful for pattern formation when manufacturing a semiconductor device.

EMBODIMENT 2

Figure 4:
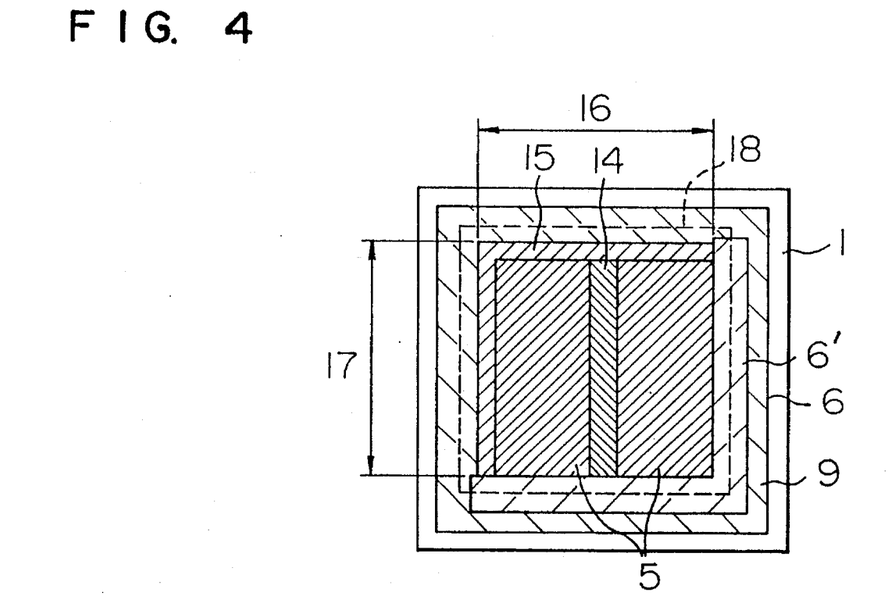
FIG. 4 is a plan view showing a structure of a mask for forming contact holes of a 64 Mbit DRAM according to the present invention.

A second embodiment of the present invention will hereinafter be described with reference to FIG. 4. FIG. 4 is a plan view showing a structure of a photomask which is used to form contact holes of a 64 Mbits-dynamic random access memory (DRAM). Two DRAM element areas 5 are arranged in a transparent substrate 1. A scribing area 14 is provided between the two pattern element areas 5. In addition, in a peripheral scribing area 15 on two sides perpendicular to each other, a pattern for measuring the accuracy of the mask alignment, a target pattern for the mask alignment, and the like are arranged, which becomes necessary for the process of manufacturing a device.

In the two sides opposite to the other sides of the scribing area, a pattern configuration 6' of light shielding portion 6 of the present invention is arranged. The step-and-repeat process in the projection aligner is performed at a pitch 16 in the transverse direction and at a pitch 17 in the longitudinal direction. The peripheral portion which is located outside a dotted line 18 as the setting center is mechanically shielded from the light beams by a mechanical light shielding plate of the aligner. In this connection, the dotted line 18 is set at a distance equal to or longer than the positional accuracy of the mechanical light shielding plate from the scribing area such that the mechanical light shielding plate is not shifted to the scribing area by mistake. In addition, the width of the pattern configuration 6' portion is set to a value equal to or larger than the positional accuracy of the mechanical light shielding plate, and the dotted line 18 is arranged in about the central portion of the pattern configuration 6'. Further, at least three of the four corner portions have pattern configuration.

As a result of using this photomask in order to manufacture the 64 MBits-DRAM, the double exposure in the periphery of the chip can be perfectly prevented, and thus the a device can be manufactured. In addition, in the case where the pattern element area 5 is formed by one chip, or the photomask having the pattern configuration 6' is applied to devices other than DRAM, the same effects can be obtained.

Figure 5A:
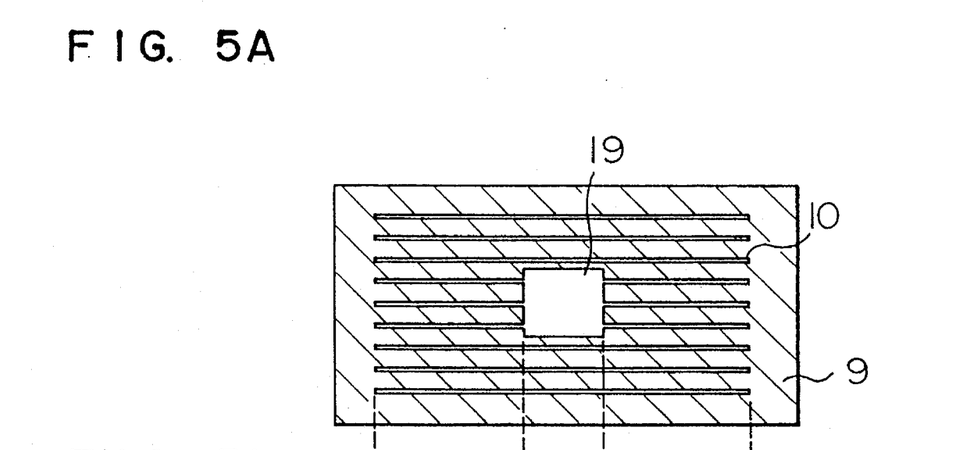
FIGS. 5A and 5B are respectively a plan view showing a structure of a window pattern portion for aligning the position of the mask according to the present invention, and a view showing the light intensity distribution of the projected light beams on the wafer when using the mask shown in FIG. 5A.
Figure 5B:
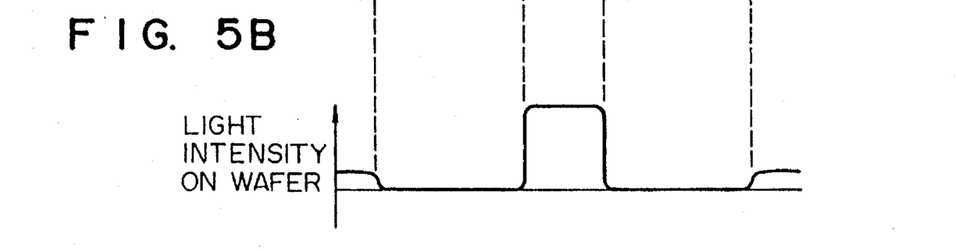

Further, a description will hereinbelow be given with respect to an example in which the pattern configuration 6' of the present invention is arranged in the periphery of a window pattern which is used to align the mask position with reference to FIGS. 5A and 5B. FIG. 5A is a plan view showing a structure of the window pattern portion which is used to align the mask position. FIG. 5B shows the distribution of the light intensity on the wafer corresponding to the mask position.

Figure 3B:
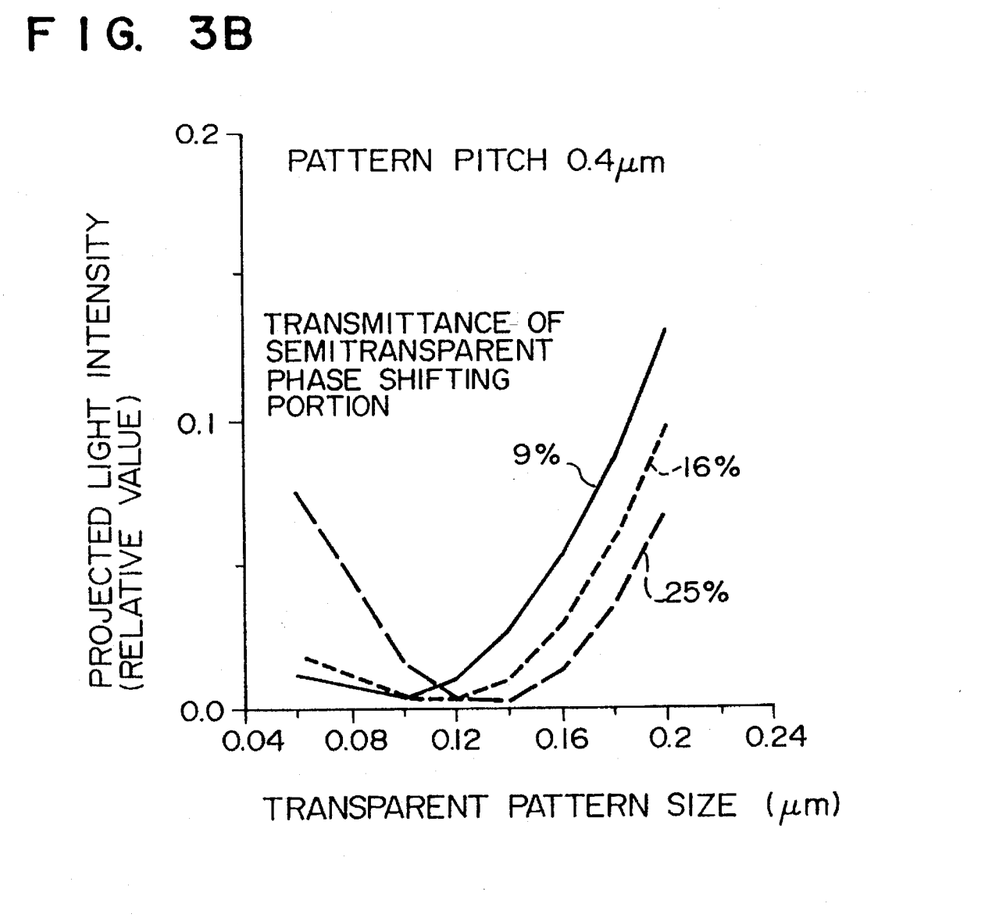
FIG. 3B is a graphical representation showing the relationship between the size of a transparent pattern of the photomask according to the present invention and the intensity of projected exposure light beams.

As shown in FIG. 5A, a transparent portion 10 which has a size fulfilling the conditions for forming the dark portion of FIG. 3B is formed around a window pattern 19. It can be seen that in the distribution of the light intensity on the wafer of the photomask of FIG. 5A at that time, the light intensity in the periphery of the window pattern is, as shown in FIG. 5B, zero, and thus signals representing the window pattern are obtained with a high signal-to-noise (S/N) ratio and the judgment of the position is performed with accuracy. In such a way, the light shielding pattern configuration of the present invention is applicable to a pattern utilizing light intensity signals each having a high S/N ratio from a mask pattern and other patterns requiring the light shielding portion, as well as to the light shielding in the periphery of a device chip.

EMBODIMENT 3

Hereinbelow, an example will be shown in which a semiconductor device is manufactured according to the present invention. FIGS. 6A through 6D are cross sectional views showing steps of a process of manufacturing a semiconductor device. By using the conventional method, a P type well layer 21, a P type layer 22, a field oxide film 23, a polycrystalline Si/SiO$_2$ gate 24, a high impurity concentration P type diffusion layer 25, a high impurity concentration N type diffusion layer 26, and the like are formed in an N$^-$ type Si substrate 20.

Next, by using the conventional method, an insulating film 27 made of phosphor silicate glass (PSG) is deposited thereon. Then, a photoresist 28 is applied thereto, and a hole pattern 29 is formed by using the semitransparent phase shifting mask of the present invention (refer to FIG. 6B).

Figure 6A:
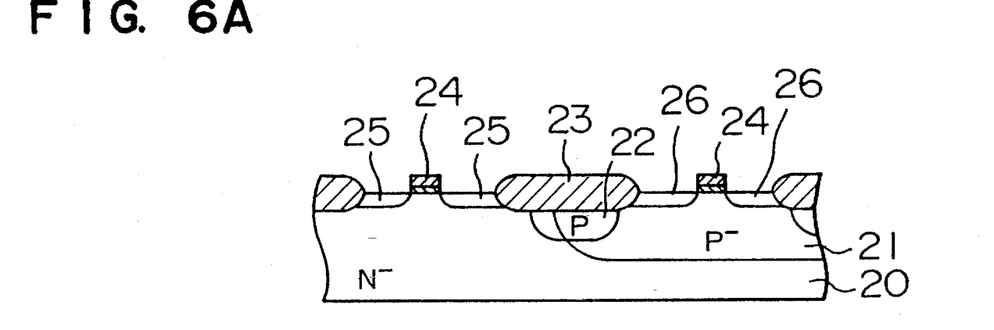
FIGS. 6A through 6D are cross sectional views showing steps of a process of manufacturing a semiconductor device according to the present invention.
Figure 6B:
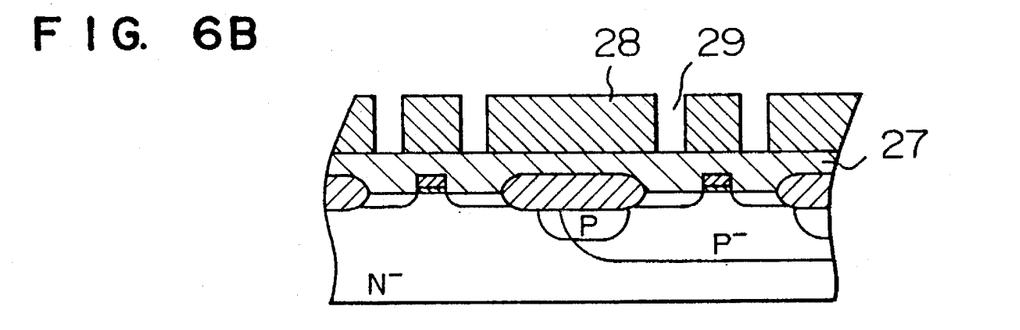
Figure 6C:
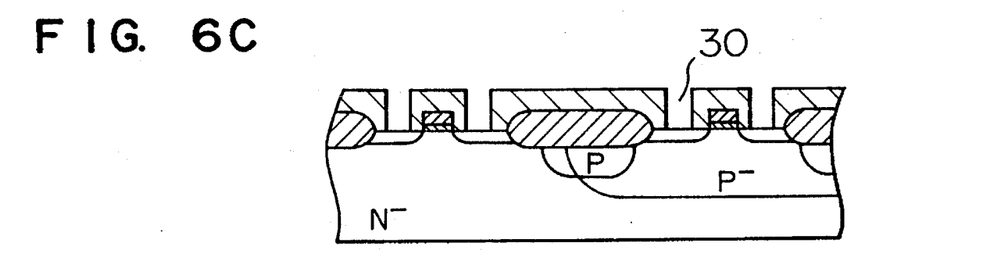
Figure 6D:
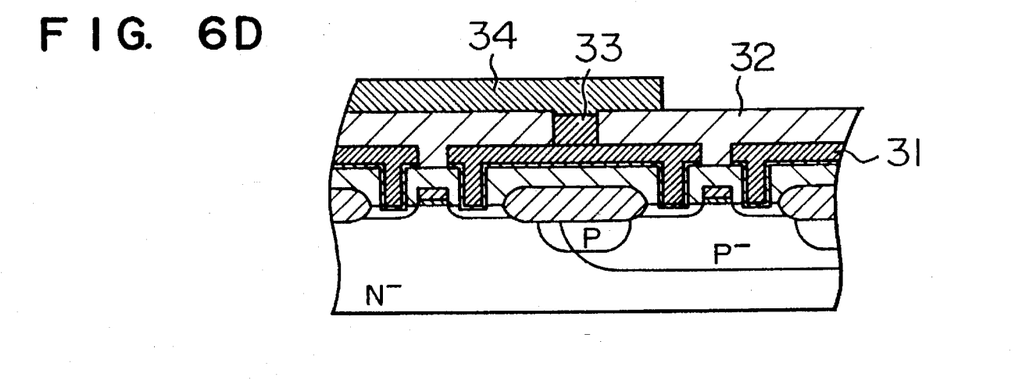

Next, an insulating film 27 is selectively etched by dry etching with the resultant photoresist as an etching mask, thereby to form contact holes 30 (refer to FIG. 6C). Then, by using the conventional method, a W/TiN electrode wiring 31 is formed, and an interlayer insulating film 32 is also formed. Next, a photoresist is applied thereto, and then by using a conventional method, a hole pattern 33 is formed using the semitransparent phase shifting mask of the present invention. Then, a W plug is plugged in the hole pattern 33 to connect a second level Al wiring 34 thereto (refer to FIG. 6D). In a subsequent passivation process, the conventional method is employed.

Incidentally, in the present embodiment, only the main manufacturing processes have been described. In this connection, the same processes as those of the conventional method are employed except that the semitransparent phase shifting mask of the present invention is used in the lithography process of forming the contact hole. By the above-mentioned processes, CMOS LSI chips can be manufactured at a high yield.

As set forth hereinabove, according to the present invention, by forming the semitransparent phase shifting portion and the transparent portion with the optimal size combination, even if a light-shielding film is not newly formed, the effective dark portion can be formed. In addition, without increasing the number of processes of forming the mask, a practical semitransparent phase shifting mask can be produced. Further, as a result of manufacturing the semiconductor device by using the photomask of the present invention, it is possible to form a pattern in which the effects inherent in the semitransparent phase shifting mask are sufficiently utilized, without any problem in the double exposure portion, and also it is possible to realize the reduction of the device area.

It is further understood by those skilled in the art that the foregoing description is a preferred embodiment of the disclosed device and that various changes and modifications may be made in the invention without departing from the spirit and scope thereof.

What is claimed is:

1. A pattern forming method, comprising the steps of:

forming a photoresist film on a substrate;

placing said substrate having said photoresist film on a sample stage of an aligner;

exposing, with a projection exposure optical system, a predetermined first area of said substrate by using a photomask including first and second portions, said first portion being an element pattern portion including a semitransparent phase shifting region, and said second portion including a semitransparent phase shifting pattern and a transparent pattern which are arranged in an alternating and periodic pattern with a predetermined repeated pitch; wherein said semitransparent phase shifting region and said semitransparent phase shifting pattern are semitransparent with respect to exposure light, said transparent pattern is transparent with respect to exposure light, light that has passed through said semitransparent phase shifting region and said semitransparent phase shifting pattern is substantially 180 degrees out of phase with respect to light that has passed through said transparent pattern, and wherein said second portion is disposed outside a periphery of the first portion;

moving said substrate horizontally; and exposing a second area of said substrate which is adjacent to said predetermined first area by using said photomask.

2. A pattern forming method according to claim 1, wherein the transmittance of said semitransparent phase shifting region with respect to the exposure light is not higher than 25%.

3. A method of manufacturing a semiconductor device, comprising the steps of:

forming impurity-doped layers in a surface of a semiconductor substrate;

forming an insulating film on said semiconductor substrate having said impurity-doped layers;

forming opening portions through a photoresist film on said impurity-doped layers by a pattern forming method, said pattern forming method including the steps of: forming said photoresist film on said insulating film; placing said semiconductor substrate having said photoresist film on a sample stage of an aligner; exposing, with a projection exposure optical system, a predetermined first area of said semiconductor substrate by using a photomask including first and second portions, said first portion being an element pattern portion including a semitransparent phase shifting region, and said second portion including a semitransparent phase shifting pattern and a transparent pattern which are arranged in an alternating and periodic pattern with a predetermined repeated pitch; wherein said semitransparent phase shifting region and said semitransparent phase shifting pattern are semitransparent with respect to exposure light, said transparent pattern is transparent with respect to exposure light, light that has passed through said semitransparent phase shifting region and said semitransparent phase shifting pattern is substantially 180 degrees out of phase with respect to light that has passed through said transparent pattern, and wherein said second portion is disposed outside a periphery of the first portion; moving said semiconductor substrate horizontally; and exposing a second area of said semiconductor substrate which is adjacent to said predetermined first area by using said photomask;

etching selectively said insulating film with said photoresist film having said opening portions as a mask to expose said impurity-doped layers; and forming a wiring layer, which is electrically connected to said impurity-doped layers, on said insulating film.

4. A pattern forming method according to claim 3, wherein the transmittance of said semitransparent phase shifting region with respect to the exposure light is not higher than 25%.

5. A method of manufacturing a semiconductor device, comprising the steps of:

forming a first insulating film on a substrate;

forming a first wiring layer on said first insulating film;

forming a second insulating film on said substrate having said first wiring layer;

forming opening portions through a photoresist film on said first wiring layer by a pattern forming method, said pattern forming method including the steps of: forming said photoresist film on said second insulating film; placing said substrate having said photoresist film on a sample stage of an aligner; exposing, with a projection exposure optical system, a predetermined first area of said substrate by using a photomask including first and second portions, said first portion being an element pattern portion including a semitransparent phase shifting region, and said second portion including a semitransparent phase shifting pattern and a transparent pattern which are arranged in an alternating and periodic pattern with a predetermined repeated pitch; wherein said semitransparent phase shifting region and said semitransparent phase shifting pattern are semitransparent with respect to exposure light, said transparent pattern is transparent with respect to exposure light, light that has passed through said semitransparent phase shifting region and said semitransparent phase shifting pattern is substantially 180 degrees out of phase with respect to light that has passed through said transparent pattern, and wherein said second portion is disposed outside a periphery of the first portion; moving said substrate horizontally; and exposing a second area of said substrate which is adjacent to said predetermined first area by using said photomask;

etching selectively said second insulating film with said photoresist film having said opening portions as a mask to expose said first wiring layer; and forming a second wiring layer, which is electrically connected to said first wiring layer, on said second insulation film.

6. A pattern forming method according to claim 5, wherein the transmittance of said semitransparent phase shifting region with respect to the exposure light is not higher than 25%.

7. A pattern forming method, comprising the steps of:

preparing a mask having a mask pattern containing first and second portions, said first portion being a semitransparent phase shifting region, said second portion including a semitransparent phase shifting pattern and a transparent pattern which are arranged in an alternating and periodic pattern with a predetermined repeated pitch; wherein said semitransparent phase shifting region and said semitransparent phase shifting pattern are semitransparent with respect to exposure light, said transparent pattern transparent with respect to exposure light, and light that has passed through said semitransparent phase shifting region and said semitransparent phase shifting pattern is substantially 180 degrees out of phase with respect to light that has passed through said transparent pattern; and wherein light that has passed through said second portion has an intensity that is smaller than that of light that has passed through said first portion;

preparing a substrate;

illuminating said mask with the exposure light to project the mask pattern onto said substrate through a projection exposure optical system.

8. A pattern forming method according to claim 7, wherein said mask has a size larger than that of a minimum pattern which is allowed to be transferred by said second portion.

9. A pattern forming method according to claim 7, wherein the predetermined repeated pitch is defined as:

$$P=\alpha \cdot \lambda/NA,$$

where NA represents a numerical aperture of a projection lens of the projection exposure optical system, $\lambda$ represents a wavelength of the exposure light, and $\alpha \leq 0.8$.

10. A pattern forming method according to claim 7, wherein a size ratio $\alpha$ of the size of said transparent pattern to the size of said semitransparent phase shifting pattern is defined as:

$$\alpha=\beta \cdot \sqrt{T},$$

where T represents the transmittance of the semitransparent phase shifting pattern, and $0.5 \leq \beta \leq 2.0$.

11. A pattern forming method according to claim 7, wherein light which has passed through said second portion has a light intensity on a region of said substrate equal to or lower than one-half that of light which has passed through said first portion, when said substrate region is double-exposed through said mask in a step-and-repeat exposure.

12. A pattern forming method according to claim 11, wherein said substrate region which is double-exposed is provided at a peripheral portion of said mask.

13. A pattern forming method according to claim 7, wherein the predetermined repeated pitch is equal to or smaller than a critical resolution of the projection exposure optical system.

14. A pattern forming method according to claim 7, wherein the second portion is disposed outside a periphery of the first portion.

15. A pattern forming method according to claim 7, wherein the semitransparent phase shifting pattern and transparent pattern of the second portion are arranged in said alternating and periodic pattern with said predetermined repeated pitch for reducing resolvability of said alternating and periodic pattern with respect to the light passing through the second portion.

16. A pattern forming method according to claim 7, wherein the transmittance of said semitransparent phase shifting region with respect to the exposure light is not higher than 25%.

17. A pattern forming method, comprising the steps of:

forming a resist film on a substrate;

light-exposing a predetermined first region of said resist film through a projection exposure optical system using a mask which includes first and second portions, said first portion being an element formation chip section including a semitransparent phase shifting region, and said second portion having a semitransparent phase shifting pattern and a transparent pattern arranged in an alternating and periodic pattern with a predetermined repeated pitch that is not larger than the critical resolution of the projection exposure optical system; wherein said semitransparent phase shifting region and said semitransparent phase shifting pattern are semitransparent with respect to exposure light, said transparent pattern is transparent with respect to exposure light, light that has passed through said semitransparent phase shifting region and said semitransparent phase shifting pattern is substantially 180 degrees out of phase with respect to light that has passed through said transparent pattern, and wherein said second portion is disposed at a peripheral portion of said element formation chip section within said mask;

moving said substrate in a direction so as to enable light-exposure of a second region of said resist film by using said mask; and light-exposing the second region of said resist film through the projection exposure optical system by using said mask.

18. A pattern forming method according to claim 17, wherein said second portion is disposed at two adjacent sides of said peripheral portion of said element formation chip section within said mask.

19. A pattern forming method according to claim 17, wherein the transmittance of said semitransparent phase shifting region with respect to the exposure light is not higher than 25%.

20. A pattern forming method, comprising the steps of:
forming a resist film on a substrate;

light-exposing a predetermined first region of said resist film through a projection exposure optical system by using a mask which includes first and second portions, said first portion being an element formation chip section including a semitransparent phase shifting region, and said second portion having a semitransparent phase shifting pattern and a transparent pattern arranged in an alternating and periodic pattern with a predetermined repeated pitch, wherein light that has passed through said second portion has an intensity on the resist film that is smaller than an intensity on the resist film of light that has passed through said first portion; wherein said semitransparent phase shifting region and said semitransparent phase shifting pattern are semitransparent with respect to exposure light, said transparent pattern is transparent with respect to exposure light, light that has passed through said semitransparent phase shifting region and said semitransparent phase shifting pattern is substantially 180 degrees out of phase with respect to light that has passed through said transparent pattern, and wherein said second portion is disposed at a peripheral portion of said element formation chip section within said mask;

moving said substrate in a direction so as to enable light-exposure of a second region of said resist film by using said mask; and light-exposing the second region of said resist film through the projection exposure optical system by using said mask.

21. A pattern forming method according to claim 20, wherein the predetermined repeated pitch is equal to or smaller than a critical resolution of the projection exposure optical system.

22. A pattern forming method according to claim 20, wherein the transmittance of said semitransparent phase shifting region with respect to the exposure light is not higher than 25%.

23. A pattern forming method, comprising the steps of:
preparing a substrate;

illuminating a mask with exposure light by using an aligner having a masking blade mounted thereon for changing an area through which the exposure light is projected; and projecting and exposing a mask pattern on the mask onto the substrate by using a projection exposure optical system;

wherein said mask used in said aligner includes first and second portions, said first portion being an element formation chip section including a semitransparent phase shifting region, and said second portion having a semitransparent phase shifting pattern and a transparent pattern arranged in an alternating and periodic pattern with a predetermined repeated pitch;

wherein said semitransparent phase shifting region and said semitransparent phase shifting pattern are semitransparent with respect to exposure light, said transparent pattern is transparent with respect to exposure light, and light that has passed through said semitransparent phase shifting region and said semitransparent phase shifting pattern is about 180 degrees out of phase with respect to light that has passed through said transparent pattern;

wherein said second portion is disposed at a peripheral portion of said element formation chip section within said mask;

wherein light that has passed through said second portion has an intensity on a projection surface that is smaller than an intensity on the projection surface of light that has passed through the first portion; and wherein said second portion is disposed on said mask such that an edge of said masking blade is projected onto said second portion by said exposure light.

24. A pattern forming method according to claim 23, wherein the predetermined repeated pitch is equal to or smaller than a critical resolution of the projection exposure optical system.

25. A pattern forming method according to claim 23, wherein the semitransparent phase shifting pattern and transparent pattern of the second portion are arranged in said alternating and periodic pattern with said predetermined repeated pitch for reducing resolvability of said alternating and periodic pattern with respect to the light passing through the second portion.

26. A pattern forming method according to claim 23, wherein the transmittance of said semitransparent phase shifting region with respect to the exposure light is not higher than 25%.

27. A pattern forming method, comprising the steps of:
forming a resist film on a substrate; and light-exposing a predetermined area of the resist film on said substrate through a projection exposure optical system by using a mask;

wherein said mask contains first and second portions, said first portion being a semitransparent phase shifting region, said second portion including a semitransparent phase shifting pattern and a transparent pattern which are arranged in an alternating and periodic pattern with a predetermined repeated pitch; and wherein light that has passed through said semitransparent phase shifting region and said semitransparent phase shifting pattern is about 180 degrees out of phase with respect to light that has passed through said transparent pattern.

28. A pattern forming method according to claim 27, wherein the predetermined repeated pitch is equal to or smaller than a critical resolution of the projection exposure optical system.

29. A pattern forming method according to claim 27, wherein the transmittance of said semitransparent phase shifting region with respect to the exposure light is not higher than 25%.

\* \* \* \* \*

UNITED STATES PATENT AND TRADEMARK OFFICE
CERTIFICATE OF CORRECTION

PATENT NO. : 5,578,421
DATED : November 26, 1996
INVENTOR(S) : N. HASEGAWA et al It is certified that error appears in the above-indentified patent and that said Letters Patent is hereby corrected as shown below:

IN THE CLAIMS

Column 8, claim 2, line 22, change "according to claim 1" to
--comprising the steps of:
   forming a photoresist film on a substrate;
   placing said substrate having said photoresist film on a sample stage of an aligner;
   exposing, with a projection exposure optical system, a predetermined first area of said substrate by using a photomask including first and second portions, said first portion being an element pattern portion including a semitransparent phase shifting region, and said second portion including a semitransparent phase shifting pattern and a transparent pattern which are arranged in an alternating and periodic pattern with a predetermined repeated pitch; wherein said semitransparent phase shifting region and said semitransparent phase shifting pattern are semitransparent with respect to exposure light, said transparent pattern is transparent with respect to exposure light, light that has passed through said semitransparent phase shifting region and said semitransparent phase shifting pattern is substantially 180 degrees out of phase with respect to light that has passed through said transparent pattern, and wherein said second portion is disposed outside a periphery of the first portion;
   moving said substrate horizontally; and
   exposing a second area of said substrate which is adjacent to said predetermined first area by using said photomask;--.

Column 8, claim 4, line 66, change "A pattern forming method according to claim 3" to --A method of manufacturing a semiconductor device, comprising the steps of:
   forming impurity-doped layers in a surface of a semiconductor substrate;
   forming an insulating film on said semiconductor substrate having said impurity-doped layers;
   forming opening portions through a photoresist film on said impurity-doped

UNITED STATES PATENT AND TRADEMARK OFFICE
CERTIFICATE OF CORRECTION

PATENT NO. : 5,578,421
DATED : November 26, 1996
INVENTOR(S) : N. HASEGAWA et al It is certified that error appears in the above-indentified patent and that said Letters Patent is hereby corrected as shown below:

layers by a pattern forming method, said pattern forming method including the steps of: forming said photoresist film on said insulating film; placing said semiconductor substrate having said photoresist film on a sample stage of an aligner; exposing, with a projection exposure optical system, a predetermined first area of said semiconductor substrate by using a photomask including first and second portions, said first portion being an element pattern portion including a semitransparent phase shifting region, and said second portion including a semitransparent phase shifting pattern and a transparent pattern which are arranged in an alternating and periodic pattern with a predetermined repeated pitch; wherein said semitransparent phase shifting region and said semitransparent phase shifting pattern are semitransparent with respect to exposure light, said transparent pattern is transparent with respect to exposure light, light that has passed through said semitransparent phase shifting region and said semitransparent phase shifting pattern is substantially 180 degrees out of phase with respect to light that has passed through said transparent pattern, and wherein said second portion is disposed outside a periphery of the first portion; moving said semiconductor substrate horizontally; and exposing a second area of said semiconductor substrate which is adjacent to said predetermined first area by using said photomask;
    etching selectively said insulating film with said photoresist film having said opening portions as a mask to expose said impurity-doped layers; and
    forming a wiring layer, which is electrically connected to said impurity-doped layers, on said insulating film;--.

Column 9, claim 6, line 42, change "A pattern forming method according to claim 5 " to --A method for manufacturing a semiconductor device, comprising the steps of:
    forming a first insulating film on a substrate;
    forming a first wiring layer on said first insulating film;
    forming a second insulating film on said substrate having said first wiring layer;

UNITED STATES PATENT AND TRADEMARK OFFICE
CERTIFICATE OF CORRECTION

PATENT NO. : 5,578,421
DATED : November 26, 1996
INVENTOR(S) : N. HASEGAWA et al It is certified that error appears in the above-indentified patent and that said Letters Patent is hereby corrected as shown below:

forming opening portions through a photoresist film on said first wiring layer by a pattern forming method, said pattern forming method including the steps of: forming said photoresist film on said second insulating film; placing said substrate having said photoresist film on a sample stage of an aligner; exposing, with a projection exposure optical system, a predetermined first area of said substrate by using a photomask including first and second portions, said first portion being an element pattern portion including a semitransparent phase shifting region, and said second portion including a semitransparent phase shifting pattern and a transparent pattern which are arranged in an alternating and periodic pattern with a predetermined repeated pitch; wherein said semitransparent phase shifting region and said semitransparent phase shifting pattern are semitransparent with respect to exposure light, said transparent pattern is transparent with respect to exposure light, light that has passed through said semitransparent phase shifting region and said semitransparent phase shifting pattern is substantially 180 degrees out of phase with respect to light that has passed through said transparent pattern, and wherein said second portion is disposed outside a periphery of the first portion; moving said substrate horizontally; and exposing a second area of said substrate which is adjacent to said predetermined first area by using said photomask;
 etching selectively said second insulating film with said photoresist film having said opening portions as a mask to expose said first wiring layer ; and
 forming a second wiring layer, which is electrically connected to said first wiring layer, on said second insulation film;--.
  Column 9, claim 7, line 55, after "pattern" insert --is--,
Column 9, claim 7, line 61, after "through" insert --the alternating and periodic pattern of the semitransparent phase shifting pattern and the transparent pattern of-- , and line 64, after ";" insert -- and --.

UNITED STATES PATENT AND TRADEMARK OFFICE
CERTIFICATE OF CORRECTION

PATENT NO. : 5,578,421
DATED : November 26, 1996
INVENTOR(S) : N. HASEGAWA et al It is certified that error appears in the above-indentified patent and that said Letters Patent is hereby corrected as shown below:

Column 10, claim 11, line 21, after "through" insert --the alternating and periodic pattern of the semitransparent phase shifting pattern and the transparent pattern of--.

Column 10, claim 15, line 40, after "the" insert --alternating and periodic pattern of the semitransparent phase shifting pattern and the transparent pattern of said --.

Column 10, claim 16, line 41, change "according to claim 7" to --comprising the steps of:
    preparing a mask having a mask pattern containing first and second portions, said first portion being a semitransparent phase shifting region, said second portion including a semitransparent phase shifting pattern and a transparent pattern which are arranged in an alternating and periodic pattern with a predetermined repeated pitch; wherein said semitransparent phase shifting region and said semitransparent phase shifting pattern are semitransparent with respect to exposure light, said transparent pattern is transparent with respect to exposure light, and light that has passed through said semitransparent phase shifting region and said semitransparent phase shifting pattern is substantially 180 degrees out of phase with respect to light that has passed through said transparent pattern; and wherein light that has passed through the alternating and periodic pattern of the semitransparent phase shifting pattern and the transparent pattern of said second portion has an intensity that is smaller than that of light that has passed through said first portion;
    preparing a substrate; and
    illuminating said mask with the exposure light to project the mask pattern onto said substrate through a projection exposure optical system;--.

UNITED STATES PATENT AND TRADEMARK OFFICE
CERTIFICATE OF CORRECTION

PATENT NO. : 5,578,421
DATED : November 26, 1996
INVENTOR(S) : N. HASEGAWA et al It is certified that error appears in the above-indentified patent and that said Letters Patent is hereby corrected as shown below:

Column 11, claim 19, line 11, change "according to claim 17" to --comprising the steps of:
    forming a resist film on a substrate;
    light-exposing a predetermined first region of said resist film through a projection exposure optical system by using a mask which includes first and second portions, said first portion being an element formation chip section including a semitransparent phase shifting region, and said second portion having a semitransparent phase shifting pattern and a transparent pattern arranged in an alternating and periodic pattern with a predetermined repeated pitch that is not larger than the critical resolution of the projection exposure optical system; wherein said semitransparent phase shifting region and said semitransparent phase shifting pattern are semitransparent with respect to exposure light, said transparent pattern is transparent with respect to exposure light, light that has passed through said semitransparent phase shifting region and said semitransparent phase shifting pattern is substantially 180 degrees out of phase with respect to light that has passed through said transparent pattern, and wherein said second portion is disposed at a peripheral portion of said element formation chip section within said mask;
    moving said substrate in a direction so as to enable light-exposure of a second region of said resist film by using said mask; and
    light-exposing the second region of said resist film through the projection exposure optical system by using said mask;--.

Column 11, claim 20, line 26, after "through" insert --the alternating and periodic pattern of the semitransparent phase shifting pattern and the transparent pattern of--; and     line 28, after "through" insert --the semitransparent phase shifting region of--.

UNITED STATES PATENT AND TRADEMARK OFFICE
CERTIFICATE OF CORRECTION

PATENT NO. : 5,578,421
DATED : November 26, 1996
INVENTOR(S) : N. HASEGAWA et al It is certified that error appears in the above-indentified patent and that said Letters Patent is hereby corrected as shown below:

Column 11, claim 22, line 50, change "according to claim 20" to
--comprising the steps of:
    forming a resist film on a substrate;
    light-exposing a predetermined first region of said resist film through a projection exposure optical system by using a mask which includes first and second portions, said first portion being an element formation chip section including a semitransparent phase shifting region, and said second portion having a semitransparent phase shifting pattern and a transparent pattern arranged in an alternating and periodic pattern with a predetermined repeated pitch, wherein light that has passed through the alternating and periodic pattern of the semitransparent phase shifting pattern and the transparent pattern of said second portion has an intensity on the resist film that is smaller than an intensity on the resist film of light that has passed through the semitransparent phase shifting region of said first portion; wherein said semitransparent phase shifting region and said semitransparent phase shifting pattern are semitransparent with respect to exposure light, said transparent pattern is transparent with respect to exposure light, light that has passed through said semitransparent phase shifting region and said semitransparent phase shifting pattern is substantially 180 degrees out of phase with respect to light that has passed through said transparent pattern, and wherein said second portion is disposed at a peripheral portion of said element formation chip section within said mask;
    moving said substrate in a direction so as to enable light-exposure of a second region of said resist film by using said mask; and
    light-exposing the second region of said resist film through the projection exposure optical system by using said mask;--.

UNITED STATES PATENT AND TRADEMARK OFFICE
CERTIFICATE OF CORRECTION

PATENT NO. : 5,578,421
DATED : November 26, 1996
INVENTOR(S) : N. HASEGAWA et al It is certified that error appears in the above-indentified patent and that said Letters Patent is hereby corrected as shown below:

Column 12, claim 23, line 18, after "through" insert --the alternating and periodic pattern of the semitransparent phase shifting pattern and the transparent pattern of--;

line 21, after "through" insert --the semitransparent phase shifting region of--; and line 24, after "onto" insert --the alternating and periodic pattern of the semitransparent phase shifting pattern and the transparent pattern of--.

Column 12, claim 25, line 34, after "through" insert --the alternating and periodic pattern of the semitransparent phase shifting pattern and the transparent pattern of--.

Column 12, claim 26, line 36, change "according to claim 23" to --comprising the steps of:
    preparing a substrate;
    illuminating a mask with exposure light by using an aligner having a masking blade mounted thereon for changing an area through which the exposure light is projected; and
    projecting and exposing a mask pattern on the mask onto the substrate by using a projection exposure optical system;
    wherein said mask used in said aligner includes first and second portions, said first portion being an element formation chip section including a semitransparent phase shifting region, and said second portion having a semitransparent phase shifting pattern and a transparent pattern arranged in an alternating and periodic pattern with a predetermined repeated pitch;
    wherein said semitransparent phase shifting region and said semitransparent phase shifting pattern are semitransparent with respect to exposure light, said transparent pattern is transparent with respect to exposure light, and light that has passed through said semitransparent phase shifting region and said semitransparent phase shifting pattern is

UNITED STATES PATENT AND TRADEMARK OFFICE
CERTIFICATE OF CORRECTION

PATENT NO. : 5,578,421
DATED : November 26, 1996
INVENTOR(S) : N. HASEGAWA et al It is certified that error appears in the above-indentified patent and that said Letters Patent is hereby corrected as shown below:

about 180 degrees out of phase with respect to light that has passed through said transparent pattern;
    wherein said second portion is disposed at a peripheral portion of said element formation chip section within said mask;
    sherein light that has passed through the alternating and periodic pattern of the semitransparent phase shifting pattern and the transparent pattern of said second portion has an intensity on a projection surface that is smaller than an intensity on the projection surface of light that has passed through the semitransparent phase shifting region of the first portion;
    wherein said second portion is disposed on said mask such that an edge of said masking blade is projected onto the alternating and periodic pattern of the semitransparent phase shifting pattern and the transparent pattern of said second portion by said exposure light; and--.

Column 12, claim 28, line 56, change "according to claim 27" to --comprising the steps of:
    forming a resist film on a substrate; and
    light-exposing a predetermined area of the resist film on said substrate through a projection exposure optical system by using a mask;
    wherein said mask contains first and second portions, said first portion being a semitransparent phase shifting region, said second portion including a semitransparent phase shifting pattern and a transparent pattern which are arranged in an alternating and periodic pattern with a predetermined repeated pitch;
    wherein light that has passed through said semitransparent phase shifting region and said semitransparent phase shifting pattern is about 180 degrees out of phase with respect to light that has passed through said transparent pattern; and--.

UNITED STATES PATENT AND TRADEMARK OFFICE
CERTIFICATE OF CORRECTION

PATENT NO. : 5,578,421
DATED : November 26, 1996
INVENTOR(S) : N. HASEGAWA et al It is certified that error appears in the above-indentified patent and that said Letters Patent is hereby corrected as shown below:

Column 12, claim 29, line 60, change "according to claim 27" to
--comprising the steps of:
    forming a resist film on a substrate; and
    light-exposing a predetermined area of the resist film on said substrate through a projection exposure optical system by using a mask;
    wherein said mask contains first and second portions, said first portion being a semitransparent phase shifting region, said second portion including a semitransparent phase shifting pattern and a transparent pattern which are arranged in an alternating and periodic pattern with a predetermined repeated pitch;
    wherein light that has passed through said semitransparent phase shifting region and said semitransparent phase shifting pattern is about 180 degrees out of phase with respect to light that has passed through said transparent pattern; and--.

Signed and Sealed this

Tenth Day of February, 1998

BRUCE LEHMAN

*Commissioner of Patents and Trademarks*